United States Patent [19]

Bakermans

[11] 4,396,457
[45] Aug. 2, 1983

[54] METHOD OF MAKING BUMPED-BEAM TAPE

[75] Inventor: Frank C. Bakermans, Shiremanstown, Pa.

[73] Assignee: E. I. Du Pont de Nemours and Company, Wilmington, Del.

[21] Appl. No.: 359,040

[22] Filed: Mar. 17, 1982

[51] Int. Cl.³ ............................ C23F 1/02; B44C 1/22; C03C 15/00; C03C 25/06
[52] U.S. Cl. .................................. 156/634; 29/576 S; 156/645; 156/656; 156/902; 357/70
[58] Field of Search ............... 29/576 S, 591, 882, 29/884; 357/69, 70; 156/630, 634, 645, 656, 902, 659.1; 174/68.5

[56] References Cited

U.S. PATENT DOCUMENTS

| | | | |
|---|---|---|---|
| 3,049,791 | 8/1962 | Shackman | 29/882 |
| 3,399,452 | 9/1968 | Reid | 29/882 |
| 3,480,836 | 11/1969 | Aronstein | 156/90 X |
| 3,838,984 | 10/1974 | Crane et al. | 29/193.5 |
| 4,052,787 | 10/1977 | Shaheen et al. | 29/626 |
| 4,063,993 | 12/1977 | Burns | 156/659 |
| 4,125,441 | 11/1978 | Dugan | 204/12 |
| 4,209,355 | 6/1980 | Burns | 156/630 |

OTHER PUBLICATIONS

Insulation/Circuits, vol. 25, No. 10, Sep. 1979, Sallo, J. S., Bumped-Beam Tape for Automatic Gang Bonding, pp. 65–66.

Primary Examiner—William A. Powell

[57] ABSTRACT

Mechanically punching bumps in a thin copper or aluminum foil and etching the foil to form beams with a bump at the end of each beam. Alternatively increasing the layers by casting or gluing polyimide film to the foil and etching the polyimide film in designated areas to expose the copper or aluminum.

14 Claims, 9 Drawing Figures

METHOD OF MAKING BUMPED-BEAM TAPE

BACKGROUND OF THE INVENTION

1. Field of the Invention

This invention relates to bumped-beam tape for automatic gang bonding to semiconductors. More specifically it refers to a process for producing bumped-beam tape by mechanically forming bumps on a thin copper substrate.

2. Description of the Prior Art

As recognized in an article appearing in Insulation/Circuits, September 1979, pages 65–66, "The problem of putting the bumps on the tape is formidable. The bump must be approximately one mil high, two mils in diameter, and well enough indexed on the end of the fragile cantilevered beam that it will enter the well over the pad of a semiconductor chip when depressed by the bonding tool" . . . "Finally, the bump location must be carefully controlled dimensionally, and the bump must be formed at a reasonable cost."

The article goes on to point out that in two layer tape using polyimide as one layer, one means of copper buildup is by selectively plating the surface of the beam. The difficulty with this procedure is the plating of a two mil bump, one mil high in a two mil hole in a resist. Although bumps were formed this way they proved to be difficult to control in dimension and did not have a good adhesion to the original copper base due to difficulty of removing contamination remaining from the polyimide layer. The other method to form bumps is to plate up a thick copper layer and then etch it away leaving merely a thin beam and a bump at the end. The article states on page 67, "This can lead to bumps of very interesting shapes, since the different copper layers may etch at different rates." Such a difference in shapes is undesirable from a quality control viewpoint.

In U.S. Pat. No. 4,209,355 the process of etching away a beam to form a finger is described. U.S. Pat. No. 3,838,984 describes a method of laminating polyimide films to copper foil and depositing gold bumps on the end of fingers on the foil. U.S. Pat. No. 4,063,993 describes a method of forming bumps by using a gang bonding tool made of carbon, heated to a temperature of 550° C. to press the inner ends of the interconnect beads down against a gang bonding bump with a pressure of approximately 8 grams per square mil for a time of approximately 0.2 seconds. This is an additional step in the process that is costly. U.S. Pat. No. 4,125,441 describes a method of electro forming a bump circuit. All these prior art methods suffer from a disadvantage of not being able to prepare a bump geometrically having a controlled height, diameter and radius. This is critical since the optimum bump should be dome shaped on its exterior. A flat end on the bump results in a bigger footprint and a decreased unit loading when it is attached to the semiconductor device.

SUMMARY OF THE INVENTION

I have discovered a process using a microstamping step to form the bumps. In my process the bumps; i.e., deformations are mechanically formed by feeding a thin copper or aluminum foil either as one layer or as part of a multi-layer substrate having multiple registration holes on each edge of the substrate into a forming die. A pilot punch engages the registration holes and positions the foil under a forming punch. This forming punch has a predetermined array of male punch members arranged so that a stroke of the forming punch into the metal foil causes the formation of a predetermined array of depressions in the foil. The stroke is not sufficient to put a hole in the foil but merely forms it into the desired shape. Thereafter the foil is etched in a conventional manner to form multiple beams pointing towards the central area of the foil with one bump at the end of each beam. The foil is then plated with a nobel metal such as gold to obtain the finished product.

Alternately a polyimide film can be cast on the foil prior to feeding the foil into the forming die. The polyimide film is etched to expose the personality hole, i.e., the hole in the central region of the lead pattern of the foil. Thereafter the same procedure is followed as described above to obtain the bumps at the end of the beams. Alternately, the film can be placed on the copper by building up a composite structure of copper adhesive and polyimide, polyester, epxoy-glass or other suitable dielectric.

As another alternate method a layer of copper can be plated onto a polyimide strip to form a substrate with prepunched registration holes. The personality hole in the film can be made by etching. This substrate is fed into a forming die where a pilot punch engages the registration holes and positions the strip under a forming punch having a predetermined array of male punch members. These punch members will cause the formation of bumps or deformations on the metal foil by a downward stroke. As in the above description the copper then can be etched to form the beams with a single bump at the end of each beam.

BRIEF DESCRIPTION OF THE DRAWINGS

The present invention may be best understood by those of ordinary skill in the art by reference to the following detailed description when considered in conjunction with the accompanying drawings in which

FIG. 2, (a) through (d) are enlarged sectional views of various means for forming the deformations in the foil.

DESCRIPTION OF THE PREFERRED EMBODIMENT

Figure 1:
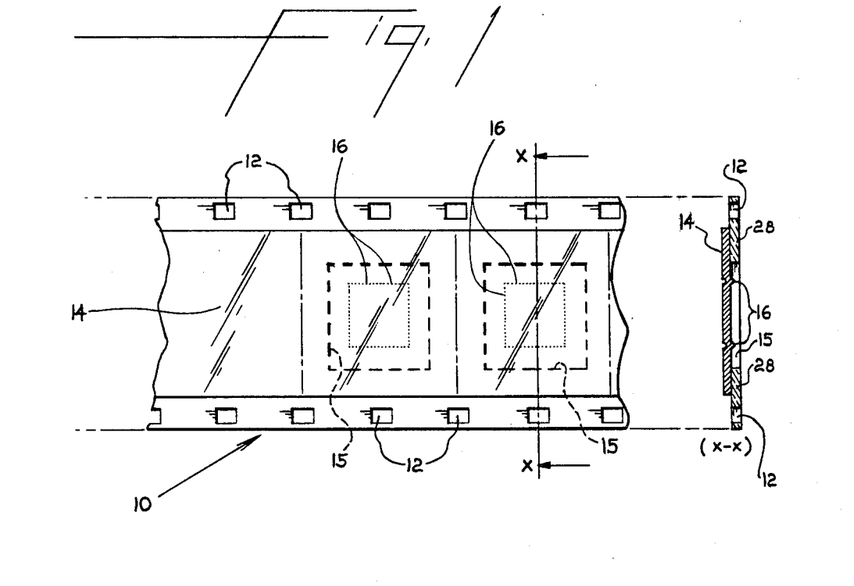
FIG. 1 is an enlarged plan view of a two layer substrate, the foil having a predetermined number of deformations formed in its surface.
Figure 1A:
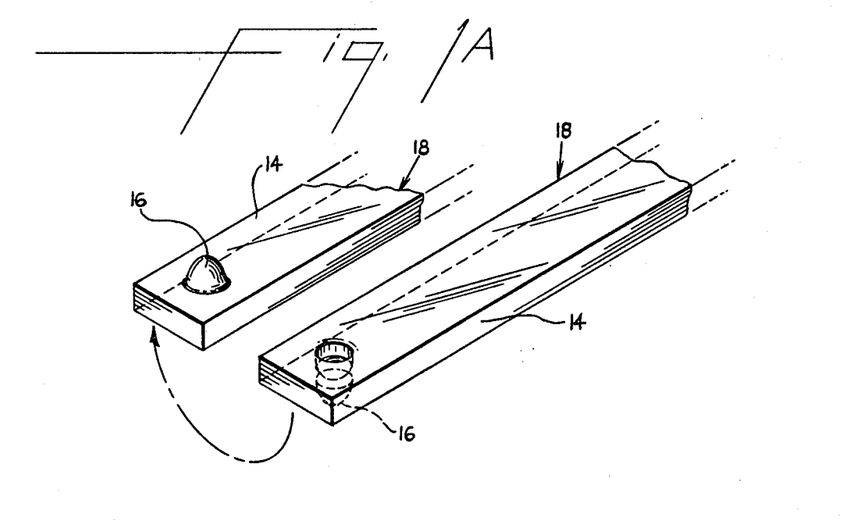
FIG. 1(A) is an enlarged view of a beam etched from the foil showing a formed deformation at its end.
Figure 2:
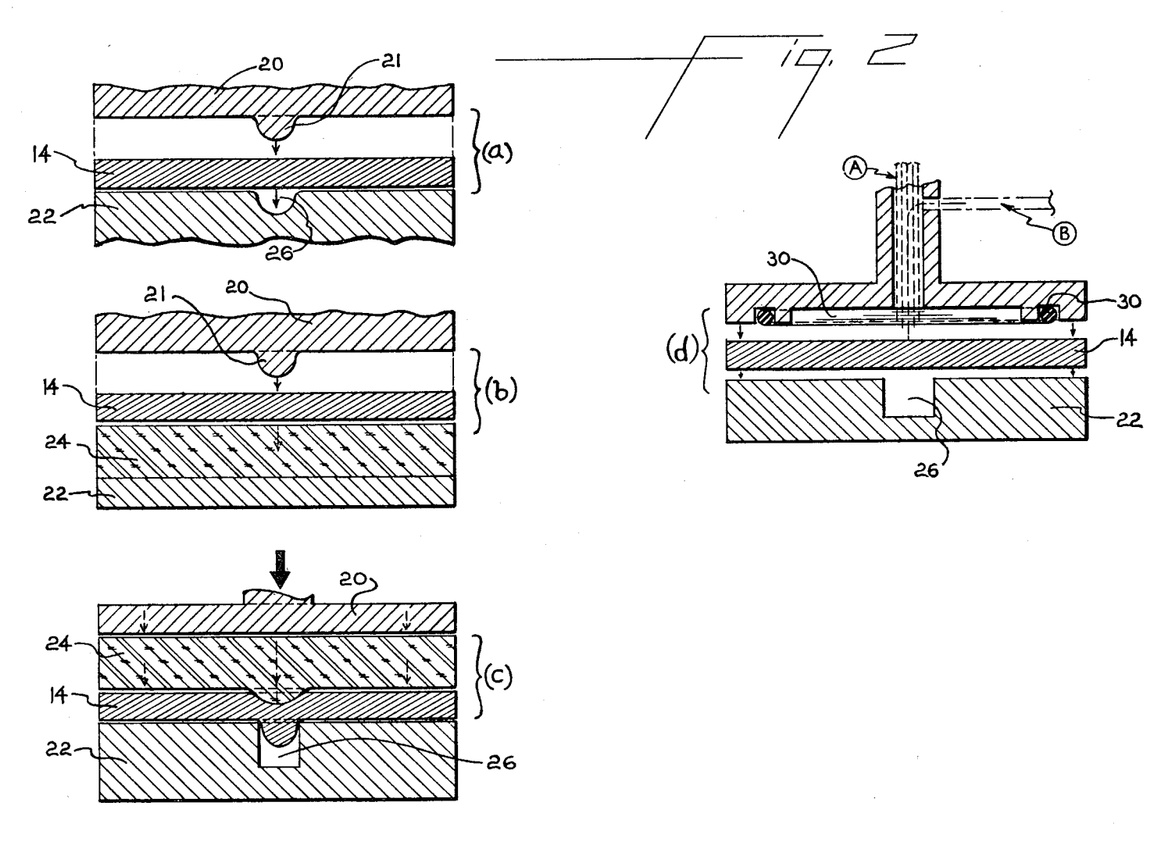

In FIG. 1 a substrate 10 having multiple punched registration, i.e., sprocket holes 12 and made from a thin copper foil 14, about 1.4 mils thick over a layer of a polyimide film has been punched in accordance with the techniques set forth in any of FIGS. 2(a–d) to form bumps 16. Thereafter the copper 14 is etched using etchant reagents such as ammonium hydroxide-hydrogen peroxide, chromic acid-hydrochloric acid or ferric chloride. Multiple beams 18 remain with the end of each beam having a bump 16 as shown in FIG. 1(A). The specific pattern of beams can be achieved using photoresist techniques such as described in U.S. Pat. No. 4,063,993.

Several die punching techniques are available for forming the bump in the copper foil. In one method FIG. 2(a) a punch member 21 pushes the copper foil 14 down into the machined portion 26 in a metal substrate 22. In embodiment (b) the punch member 21 pushes the copper 14 down into an elastomeric material 24 supported on a base 22. In embodiment (c) the forming punch 20 presses an elastomer 24 down onto the top surface of the copper 14 so that the copper moves into the opening 26 within the metal support member 22. In embodiment (d) air (A) or hydraulic (B) pressure is used to force the copper 14 down into hole 26 in the support member 22. A seal 30 prevents leakage of air or hydraulic fluid.

Figure 5:
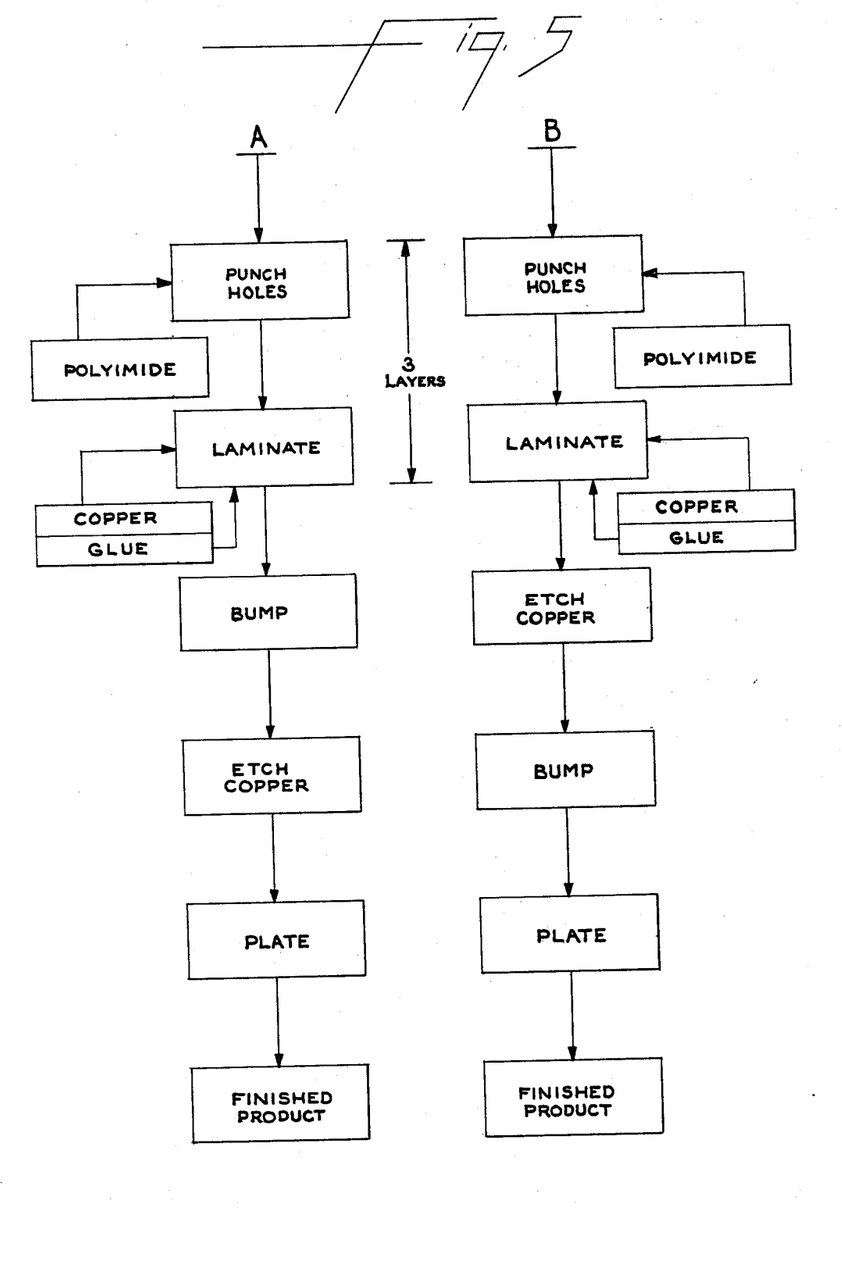
FIGS. 5, 6, and 7 are flow diagrams illustrating a typical series of steps that may be followed in preparing a bumped-beam tape in accordance with the present invention.

In FIG. 5 flow charts A and B describe a process for producing a three layered bumped-beam tape. In the first step holes are punched into a polyimide film 28 so that a strip is formed having registration holes 12 on the side as shown in FIG. 1. A personality hole 15 is punched out to expose the area where the bumps and beams will be formed in the copper layer 14. This polyimide strip is then laminated with a laminating adhesive such as PYRALUX ® adhesive system, to the copper foil 14. Thereafter, the flow diagram between A and B differs. In system A the laminated copper foil is fed into a forming die. The die has a pilot punch which engages the registration holes and positions the foil under a forming die punch 20. This forming punch has a predetermined array of male punch members 21 as seen in FIG. 2. The stroke of the forming punch 20 into the metal foil 14 causes the formation of a predetermined array of depressions in the copper foil corresponding to the number of punch members 21 on the forming punch 20. The copper is thereafter etched so that the remaining central portion of the copper foil contains a multiplicity of beams. Each beam has one bump on its end. Thereafter the entire foil surface is plated with a noble metal such as gold. In the alternative B appearing on FIG. 5 the same process is used through the lamination and production of the three layers. Thereafter the copper is directly etched to produce multiple beams 18 in the center portion of the copper foil 14. The foil is then fed into the forming punch 20 and a die punch member 21 strikes the end of each individual beam to form the bump at the end of each beam. Thereafter as in the previously described process the copper foil is plated with gold or other noble metal to produce the finished product. In both routes A or B in FIG. 5 aluminum foil can be substituted for the copper foil and polyester or epoxy-glass film can be substituted for the polyimide film.

Figure 3:
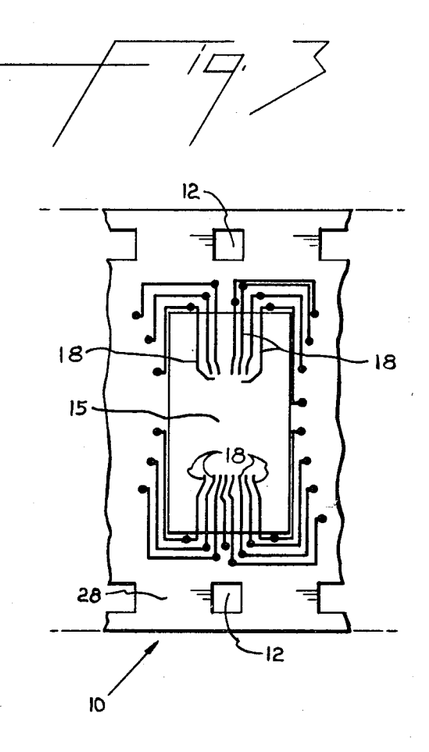
FIG. 3 shows an enlarged plan view of a foil after beams are bumped and etched.
Figure 3A:
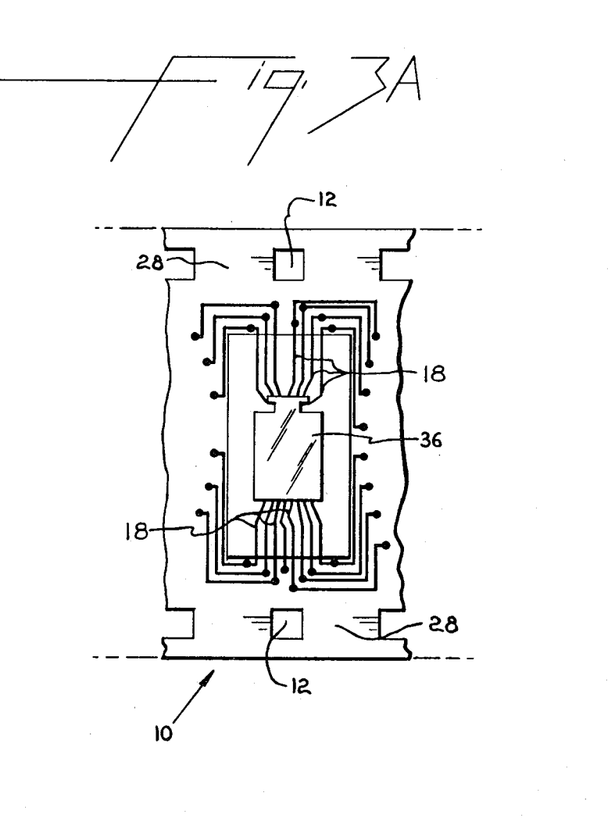
FIG. 3A shows an enlarged plan view of an etched foil just before the bumping step.
Figure 4:
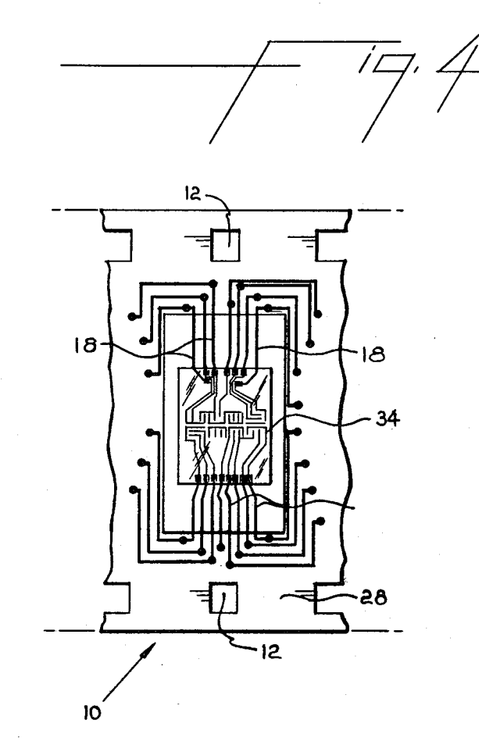
FIG. 4 is an enlarged plan view of the foil with its etched beams in place bonded to a semiconductor chip.
Figure 6:
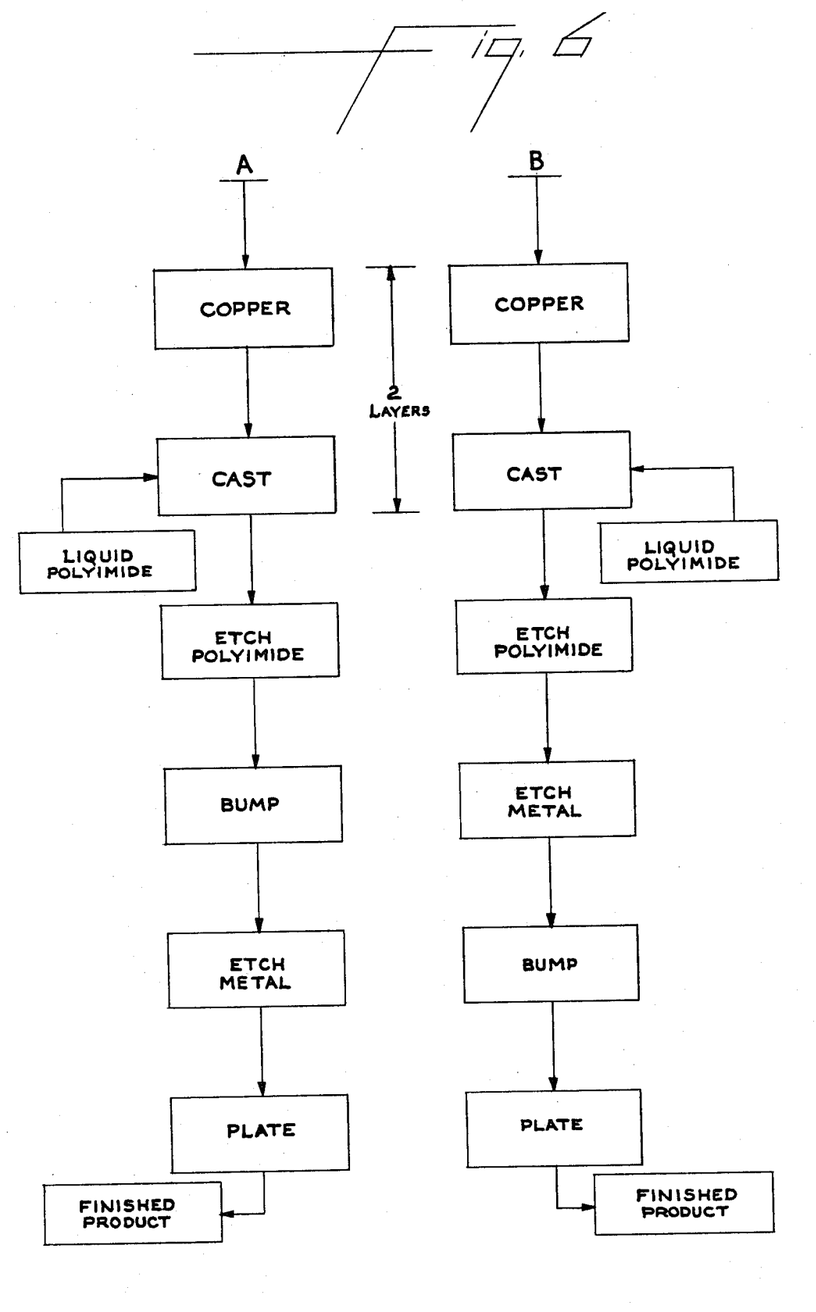

An alternative process is shown in FIG. 6 where a two-layer tape is produced. In flow chart A polyimide liquid is cast onto copper. The polyimide is then etched to provide a personality hole, exposing the copper at that point. In flow chart A the exposed copper is then fed into a forming die 20 as in the previous process and the bumps are made by the punch member 21. The copper is then exposed to an etching material such as ferric chloride and the beams are formed with the remaining portion of the exposed copper etched away. Each beam is formed with a bump at its end. Thereafter the copper foil is plated with a noble metal such as gold and the finished product results. In process B of the FIG. 6 process the same procedure is followed through the etching of the polyimide but then the copper is etched directly to form the beams. The substrate then appears as seen in FIG. 3A. Thereafter the substrate containing the copper foil is fed into a forming die 20. The punch members 21 form the bumps at the end of each beam. The remaining copper 36 is etched away before bonding the semi-conductor 34. As in the previous process the foil is plated with gold or other noble metal to form the finished product. FIG. 4 shows the product with a semiconductor chip 34 bonded thereto. In the process shown in FIGS. 6A and B, aluminum foil can be substituted for copper foil.

In FIGS. 6C and D another two-layered tape is produced by plating copper directly onto a polyimide film with registration holes 12. In this instance the polyimide is again etched to form the personality hole 15 and expose the copper. Thereafter as in the previous processes the bumps 16 are formed directly onto the exposed copper 14. Thereafter the copper is etched to form the beams 18. Alternative D differs by etching the copper directly after etching the polyimide to form the beams 18 and then form the bumps 16 at the ends of the beams as in the previously described processes. The product is thereafter plated with a noble metal such as gold to form the finished product. Polyester film can be substituted for the polyimide film in the processes shown in FIGS. 6C and D.

Figure 7:
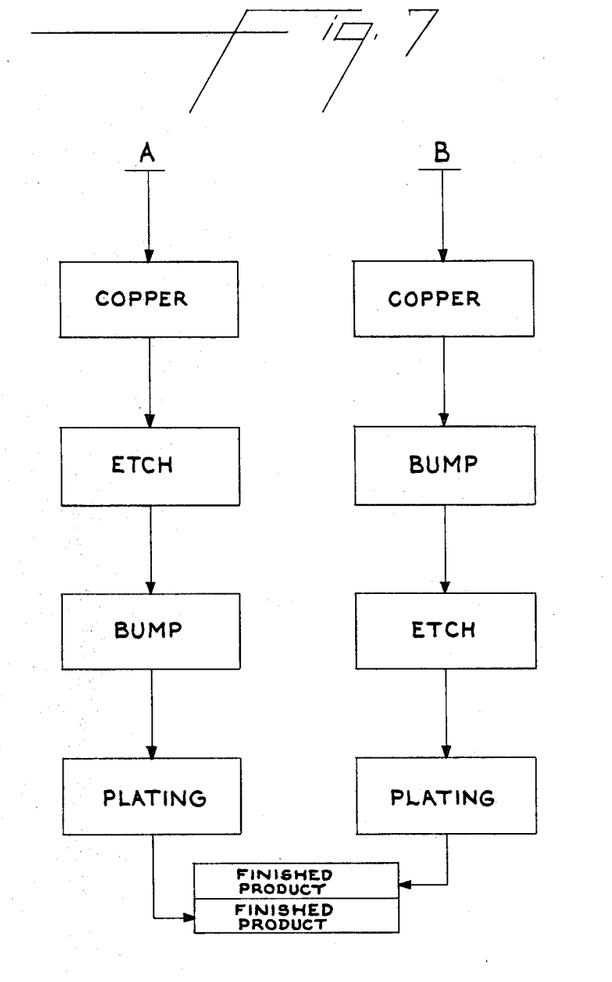

Still another method for producing the bumped-beam tape of this invention is shown in FIG. 7. Flow charts A and B describe processes employing a single layer tape. In process A, copper foil 14 having prepunched registration holes 12 on its exterior edges is etched at its center portion to form beams 18 and these beams 18 are thereafter bumped as described previously. The product is then gold plated to form the finished product. As an alternative, shown in flow chart B, the bumps 16 can be formed on the copper foil 14 and thereafter the beams 18 can be etched with a bump 16 appearing at the end of each beam. The product is thereafter plated with gold to form the finished product. Aluminum foil can be substituted for the copper foil in the process shown in FIG. 7. Etching of the aluminum is done using hydrofluoric, or sulphuric acid.

The mechanical forming operation of this invention is similar to metal stamping. However, micro techniques are necessary in order to form the bumps 16 which have a diameter of 2 mils by 1 mil thick. The polyimide film used is preferably KAPTON ® and the polyester is preferably MYLAR ®, both Du Pont trademarked products. The copper can be etched to form the beams by patterning the image with a photodefinable material such as Du Pont RISTON ®.

The plating used can be any conventional gold or gold over nickel plating and can be carried out by electro or electroless plating systems.

The polyimide can be etched with a 40% sodium hydroxide solution or it can be plasma etched with oxygen and carbontetrafluoride.

When discussing copper or aluminum foil it is understood that alloys of these metals are also acceptable.

Having thus described the invention what is claimed and desired to be secured by Letters Patent is:

1. In a method for making a bumped-beam tape for tape bonding semiconductor chips to lead frames, ceramic chip carriers or hybrid substrates, the method employing a pilot punch to engage multiple registration holes on each edge of a substrate containing at least in part a thin copper or aluminum foil, the improvement comprising (a) forming the bumps on the copper or aluminum foil by positioning the foil with the pilot punch in a forming die having a predetermined array of male punch members and causing the punch members to strike the foil with sufficient force to produce deformations in the foil, (b) selectively etching beams in the foil either before or after forming the bumps, and (c) bonding the bumps to a semiconductor chip.

2. In a method for making a bumped-beam tape for tape bonding semiconductor chips to lead frames, ceramic chip carriers or hybrid substrates, the method employing a pilot punch to engage multiple registration holes on each edge of a substrate containing at least in part a thin copper or aluminum foil, the improvement comprising (a) positioning the foil with the pilot punch in a forming die having a predetermined array of male punch members, causing the punch members to strike the foil producing corresponding deformations in the foil, (b) thereafter selectively etching beams in the foil with one of the deformations at the end of each beam and (c) bonding the deformation to a semiconductor chip.

3. In a method for making a bumped-beam tape for tape bonding semiconductor chips to lead frames, ceramic chip carriers or hybrid substrates, the method employing a pilot punch to engage multiple registration holes on each edge of a substrate containing at least in part a thin copper or aluminum foil, the improvement comprising (a) selectively etching multiple beams in the foil, (b) thereafter positioning the etched foil with the pilot punch in a forming die having a predetermined array of male punch members and causing the punch members to strike the foil producing corresponding deformations in the foil at the ends of each beam and (c) bonding the deformations to a semiconductor chip.

4. The method according to claims 2 or 3 wherein the foil is adhesively bonded to a polyester or polyimide film to form the substrate and the film is etched to provide registration holes and a personality hole.

5. The method according to claims 2 or 3 wherein the foil is adhesively bonded to a polyester, polyimide or epoxy-glass film to form the substrate and the film is prepunched to provide registration holes and a personality hole.

6. The method according to claims 2 or 3 wherein a liquid polyimide is cast onto the copper or aluminum foil to form the substrate and the polyimide is etched to provide registration holes and a personality hole.

7. The method according to claims 2 or 3 wherein copper is plated onto a polyimide, polyester or epoxy-glass film having prepunched registration holes to form the substrate.

8. The method according to claims 2 or 3 wherein copper is plated onto a polyimide or polyester film to form the substrate and the film is etched to form registration holes and a personality hole.

9. The method according to claims 2 or 3 wherein the deformations are plated with a nobel metal.

10. The method according to claims 2 or 3 wherein the foil is plated with a nobel metal.

11. The method according to claims 2 or 3 wherein the deformations are plated with gold.

12. The method according to claims 2 or 3 wherein the foil is plated with gold.

13. The method according to claims 2 or 3 wherein the foil is copper.

14. The method according to claims 2 or 3 wherein the foil is aluminum.

* * * * *